United States Patent
Ke

(10) Patent No.: US 9,690,661 B2
(45) Date of Patent: Jun. 27, 2017

(54) NON-VOLATILE MEMORY DEVICES AND CONTROLLERS

(71) Applicant: Silicon Motion, Inc., Jhubei, Hsinchu County (TW)

(72) Inventor: Kuan-Yu Ke, Zhubei (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 154 days.

(21) Appl. No.: 14/614,447

(22) Filed: Feb. 5, 2015

(65) Prior Publication Data

US 2016/0103730 A1  Apr. 14, 2016

(30) Foreign Application Priority Data

Oct. 13, 2014 (TW) .............................. 103135329 A

(51) Int. Cl.
| | |
|---|---|
| *G06F 11/00* | (2006.01) |
| *G06F 11/14* | (2006.01) |
| *G06F 13/00* | (2006.01) |
| *G11C 11/56* | (2006.01) |
| *G11C 16/34* | (2006.01) |
| *G11C 29/42* | (2006.01) |
| *G11C 29/52* | (2006.01) |

(52) U.S. Cl.
CPC .......... *G06F 11/1402* (2013.01); *G06F 11/14* (2013.01); *G06F 11/1441* (2013.01); *G06F 13/00* (2013.01); *G11C 11/5642* (2013.01); *G11C 16/3404* (2013.01); *G11C 16/3418* (2013.01); *G11C 29/42* (2013.01); *G11C 29/52* (2013.01)

(58) Field of Classification Search
CPC .... G06F 11/14; G06F 11/0727; G06F 11/073; G06F 11/10; G06F 11/1004; G06F 11/1008; G06F 11/1048; G06F 11/1072; G06F 11/1402; G06F 11/141; G06F 13/00; G06F 11/1441; G11C 11/5642; G11C 16/3404; G11C 16/3418; G11C 29/42; G11C 29/52
USPC ............................... 714/6.11, 6.1, 30, 42, 54
See application file for complete search history.

(56) References Cited

U.S. PATENT DOCUMENTS

| | | | | |
|---|---|---|---|---|
| 8,503,238 B1 * | 8/2013 | Wu | ......... | G11C 16/06 365/185.09 |
| 2007/0091677 A1 * | 4/2007 | Lasser | ................. | G06F 11/1068 365/185.09 |
| 2012/0005558 A1 * | 1/2012 | Steiner | ................ | G06F 11/1072 714/773 |

(Continued)

FOREIGN PATENT DOCUMENTS

WO   WO 2014/079550   5/2014

*Primary Examiner* — Joseph D Manoskey
(74) *Attorney, Agent, or Firm* — McClure, Qualey & Rodack, LLP

(57) ABSTRACT

For single-level cell flash memories and multi-level cell flash memories, different operations can be performed according to their stability when an abnormal status is terminated. Specifically, for the multi-level cell flash memories, when the abnormal status is terminated, a now physical block is used to proceed with write operation, and the previous physical block(s) would not be written any more. On the contrary, for the single-level cell flash memories, when the abnormal status is terminated, the controller needs to perform corresponding operations on the last physical page of the previous physical block(s).

20 Claims, 13 Drawing Sheets

(56) References Cited

U.S. PATENT DOCUMENTS

| | | | |
|---|---|---|---|
| 2012/0008386 A1* | 1/2012 | Chilappagari | G11C 11/5642 365/185.2 |
| 2012/0066443 A1* | 3/2012 | Li | G06F 12/0246 711/103 |
| 2013/0148435 A1 | 6/2013 | Matsunaga | |
| 2013/0173850 A1 | 7/2013 | Song | |
| 2015/0019922 A1* | 1/2015 | Leem | G06F 11/1048 714/706 |
| 2015/0033065 A1* | 1/2015 | Canepa | G06F 11/1008 714/6.11 |
| 2015/0149840 A1* | 5/2015 | Alhussien | H03M 13/1125 714/719 |
| 2015/0154065 A1* | 6/2015 | Ghaly | G06F 11/0793 714/6.12 |
| 2015/0227314 A1* | 8/2015 | Chen | G06F 11/1012 714/764 |
| 2015/0277786 A1 | 10/2015 | Rostock | |

* cited by examiner

| LB | PB |
|----|----|
| 435 | 222 |
| 212 | 779 |
| 112 | 832 |
| 554 | 21 |

FIG. 6

NON-VOLATILE MEMORY DEVICES AND CONTROLLERS

CROSS REFERENCE TO RELATED APPLICATIONS

This Application claims priority of Taiwan Patent Application No. 103135329, filed on Oct. 13, 2014, the entirety of which is incorporated by reference herein.

BACKGROUND OF THE INVENTION

Field of the Invention

The invention relates to a non-volatile memory devices and a controller, and more particularly to a non-volatile memory devices and a controller which have a recovery function performed after an abnormal status occurs.

Description of the Related Art

In recent years, non-volatile memories, such as flashes, are developed rapidly and applied for various electronic devices. At present, non-volatile memories will be developed continuously in capacity and operation technique. When a large amount of data is stored in non-volatile memories, it becomes more important to provide an effective and reliable recovery machine for abnormal statuses, such as power being off suddenly, in order to ensure the accuracy and security for the stored data.

BRIEF SUMMARY OF THE INVENTION

An exemplary embodiment of a non-volatile memory device is provided. The non-volatile memory device comprises a non-volatile memory, a connection interface, and a controller. The non-volatile memory is divided into a plurality of physical blocks. Each physical block is divided into a plurality of physical pages. The connection interface is connected to a host. The controller selects one physical block from the plurality of physical block to serve as an operation physical block. When receiving a write command from the host, the controller writes data corresponding to the write command into the operation physical block. When the controller performs a data read operation to read the operation physical block, if the data read operation is failed, the controller enables retry machine by using different potentials. When the controller performs the recovery operation after an abnormal status occurs, the controller cancels the retry machine and reads the physical page in the operation physical block which is written finally at the last time, and checks a verification code of the physical page. Check result of the verification code represents that an error occurs, the controller enables the retry machine by using different potentials to retry to read the physical page and re-programming the physical page.

An exemplary embodiment of a controller for a non-volatile memory device is provided. The non-volatile memory device comprises a non-volatile memory and a connection interface. The non-volatile memory is divided into a plurality of physical blocks. Each physical block is divided into a plurality of physical pages. The connection interface is connected to a host. The controller selects one physical block from the plurality of physical block to serve as an operation physical block. When receiving a write command from the host, the controller writes data corresponding to the write command into the operation physical block. When the controller performs a data read operation to read the operation physical block, if the data read operation is failed, the controller enables retry machine by using different potentials. When the controller performs the recovery operation after an abnormal status occurs, the controller cancels the retry machine and reads the physical page in the operation physical block which is written finally at the last time, and checks a verification code of the physical page. Check result of the verification code represents that an error occurs, the controller enables the retry machine by using different potentials to retry to read the physical page and re-programming the physical page.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 6 shows a schematic view showing correlation between logic blocks and physical blocks according to another exemplary embodiment;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

An embodiment of the invention provides a non-volatile memory device and a controller therein. The non-volatile memory device is implemented, for example, by an external flash device or a flash external hard disk. The non-volatile memory device can be connected to a host through a connection interface, such as USB or STATA to serve as a storage device of the host. The non-volatile memory device comprises one or more non-volatile memory cells and also comprises one or more random-access memories or conventional magnetic hard disk. The host transmits access instructions, such as read or write instructions, to the non-volatile memory device via the connection interface. The controller performs operations to the memory cells according to these read or write instructions.

In order to speed up entire access speed or reduce wastage of flash memories, some random-access memories are configured as caches or buffers. In other words, some data is not written directly into the flash memories, but temporarily into the random-access memories. In another manner, single-level cell (SLC) flash memories with higher speed are configured as the first stage cache, and cheaper multi-level cell (MLC) flash memories are configured to practically store a large amount of data.

These manners may induce some efficiency. However, when abnormal statuses occurs, such when the user takes off the non-volatile memory device from the host without appropriate measure while the power is off suddenly, a recovery operation, such as re-writing, may be performed for some data.

In an embodiment of the recovery operation performed after the abnormal statue occurs, for unstable data pages, such as data pages which belong to the same hardware circuit element or region with other data pages and are influenced by each other, in order to avoid extension of errors, the valid data pages are copied into another physical block, and the original physical block is not used any more. The embodiment also includes a process in which, when it is determined which one is valid data, only a portion of the data is read and it is determined whether the read portion of the data is valid data according to a statistics value for speeding up the determination.

In the following, a structure applied to the above embodiments is provided. Then, the embodiment will be illustrated by referring to figures.

Figure 1:
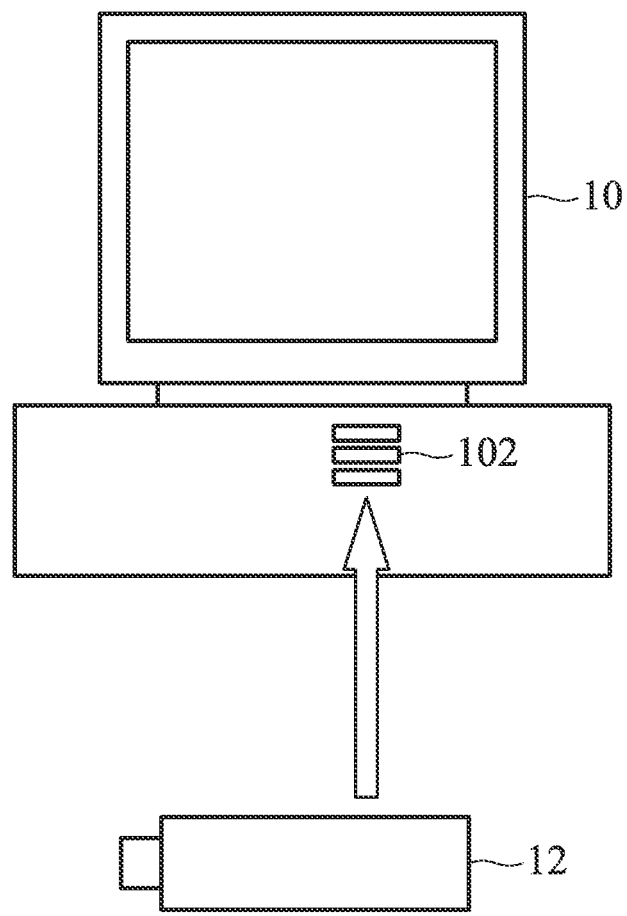
FIG. 1 shows an exemplary embodiment of a system.

Referring to FIG. 1, a first embodiment of the invention is shown.

A computer 10 comprises an USB transmission interface 102 and performs a data access operation to an USB disk 12 through the USB transmission interface 102. The above description is given as an example without limitation for the invention. For example, the computer 10 can be replaced with any other electronic device, such as a mobile phone, a table computer, a television, a camera, or any electronic apparatus requiring data storage. The USB disk 12 can be replaced with any other type of external storage device connected to the computer 10 or an internal storage device within the computer 10. The USB transmission interface 102 can be replaced with another data transmission interface, such as IEEE 1394, DATA, MS, MMC, SD, CF, IDE, or PCI interface.

An USB disk, an external hard disk, an internal magnetic disk, or a flash disk is given as an example. When the data storage device is connected to an electronic device, such as a computer, through a transmission interface, the electronic device can perform a read operation to the data storage device to determine whether the data storage device is formatted. If the data storage device has not be formatted yet, the electronic device usually asks the user to format the data storage device or not. When the user decides to format the data storage device, the electronic device sends a command to the data storage device, such that the data storage device performs a format operation by itself in response to the command. In another manner, the electronic device provides a detailed control instruction required for the format, to, for example, to build a file table in the data storage device and fill predetermined values.

Figure 2:
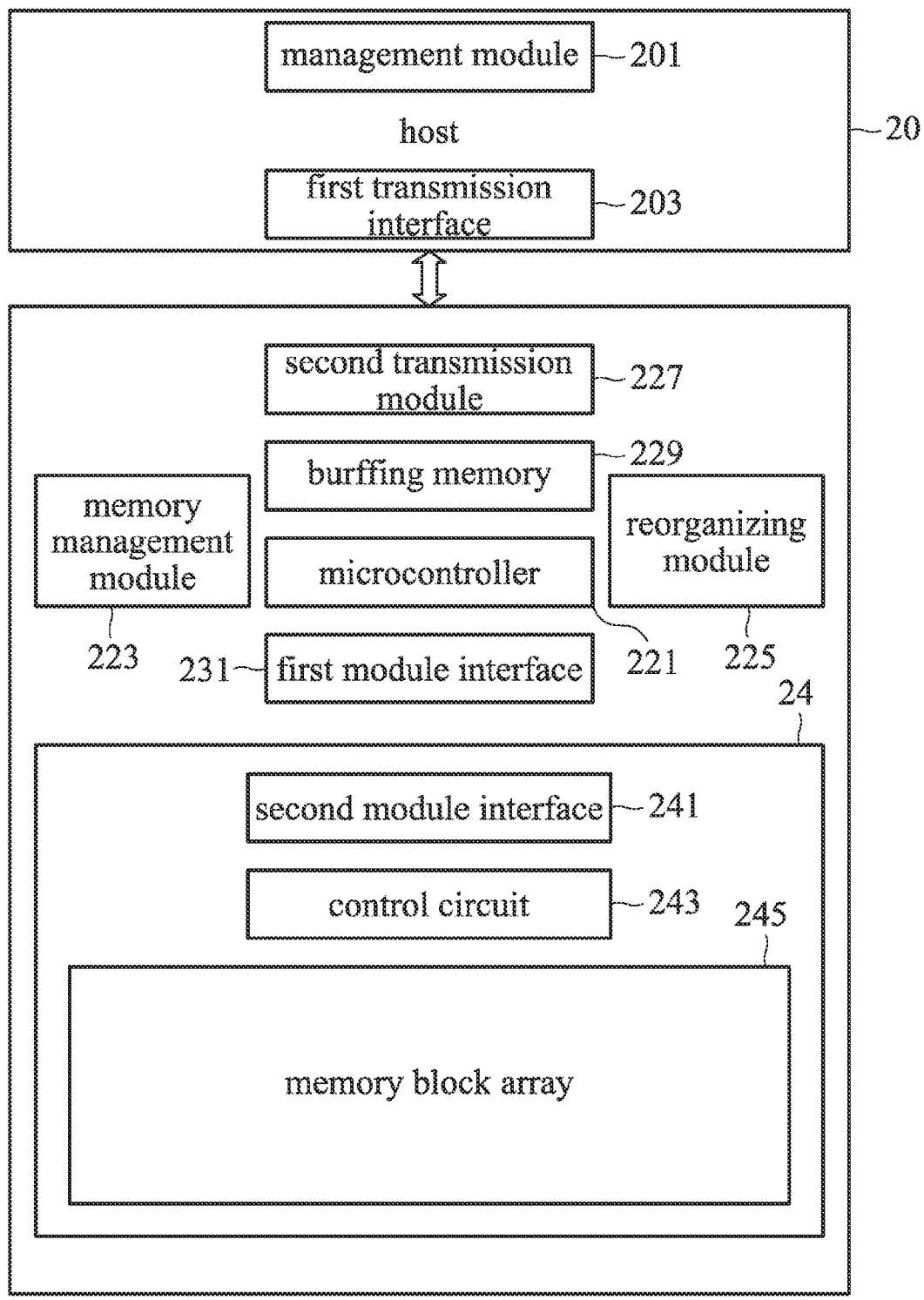
FIG. 2 shows an exemplary embodiment of a detailed structure of devices of FIG. 1.

Referring to FIG. 2, an exemplary embodiment of a detailed structure of the devices of FIG. 1.

A host 20 comprises a management module 201 and a first transmission interface 203. The host 20 accesses a data storage device 22 by hardware, software, or a combination of hardware and software via the first transmission interface 203. The host 20 described herein corresponds to the computer 10 of FIG. 1. In an embodiment, the management module 201 comprises a combination of an operation system, performed on the host, for file and data storage, a corresponding drive program, and related control circuits.

The data storage device 22 comprises a second transmission interface, a microcontroller 221, a buffering memory 229, a memory management module 223, a code reorganizing module 225, and a first module interface 231. The data storage device 22 further comprises a memory module 24. The memory module 224 comprises a second module interface, a control circuit 243, and a memory block array 245.

In the embodiment, the second transmission interface 227 corresponds to the first transmission interface 203 of the host 20, for example, to provide related process of signal transmission in machine and electronic aspect. The buffering memory 229 is used for buffering or cache architecture building during the signal transmission. The entire operation of the data storage device 22 is performed through generating an appropriate control signal by a predetermined instruction code, which is performed by the microcontroller 221, to control the operation of each element at the appropriate time. The memory management module 223 and the reorganizing module 225 may be implemented by circuit hardware or operate according to the instruction code which is assigned to the microcontroller 221 through circuits and performed by the microcontroller 221. In an alternative embodiment, the memory management module 223 and the reorganizing module 225 may be implemented in response to the corresponding instruction code which is performed by the microcontroller 221.

The first module interface 231 is used to communication with the memory module 24. The second module interface in the memory module 24 corresponds to the first module interface 231. The control circuit 243 accesses the memory block array 245 in response to the instruction of the microcontroller 221. The memory block array 245 comprises a plurality of flash memory physical blocks.

The memory management module 223 comprises process logic and a table for intercomparison and recoding of the physical blocks and logic blocks. Moreover, the data storage device 22 may further comprise an error correcting module (not shown).

The reorganizing module 225 is responsible for reorganizing the original data which was written into the memory module 24 to generate corresponding reorganized coding data and further reversely reorganize the reorganized coding data which is read from the memory module 24 to revert the value of the original data. The above operation comprises position exchanging of a bit at a specific position, inverting of the bits at a part of the positions, and reverse code reorganizing for the data at the odd address and the even address in different manners.

The objective of the code reorganizing is to achieve data stability. For example, in the flash memory, if the values of the adjacent units are the same, such as both being "0" or "1", the storage stability of the stored data may be influenced due to electronic characteristics. In other words, through the code reorganizing, the values stored in the adjacent units are "0" and "1" in the interlaced pattern, which enhances the storage stability of the data. Thus, if there is a code reorganizing function, the storage quality can be maintained even though flash memories with lower cost are used.

The code reorganizing may be performed for other objectives, for example, for avoiding the data stored in the data storage device from reading by unauthorized users. The code reorganizing can be implemented by any coding manners which have been currently known or will be developed in the future. The manners in which the original data is coded, decode, and then recovered to the original data are within the scope of the code reorganizing.

Figure 3:
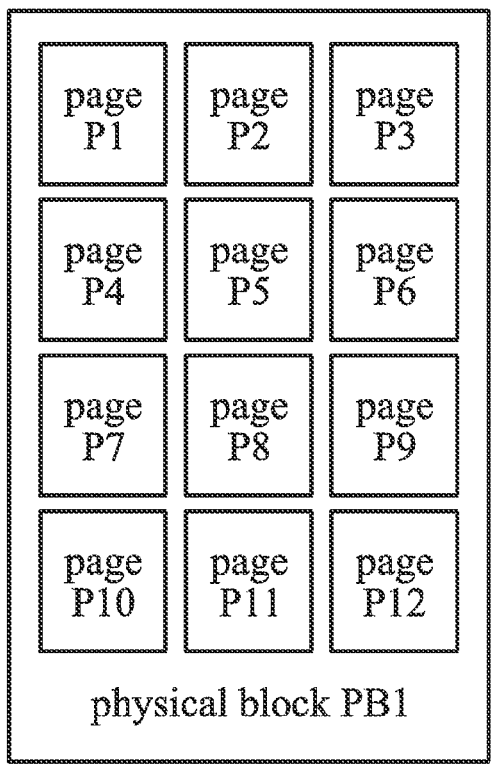
FIG. 3 shows an exemplary embodiment of relationship between the physical blocks and pages.
Figure 3:
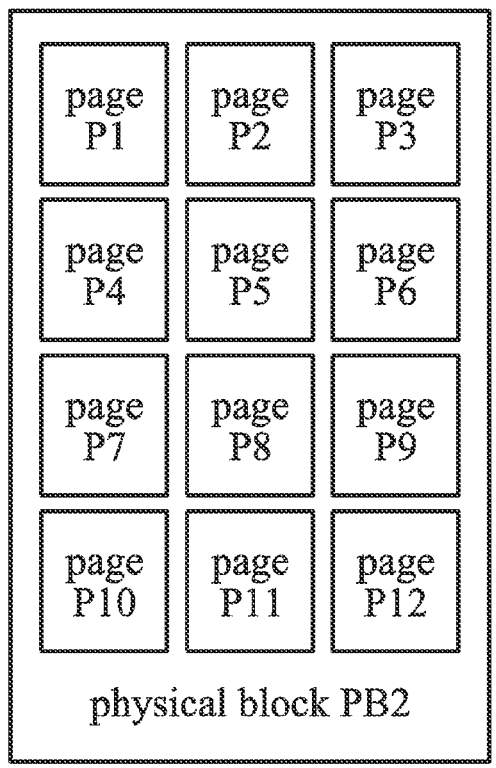
Figure 3:
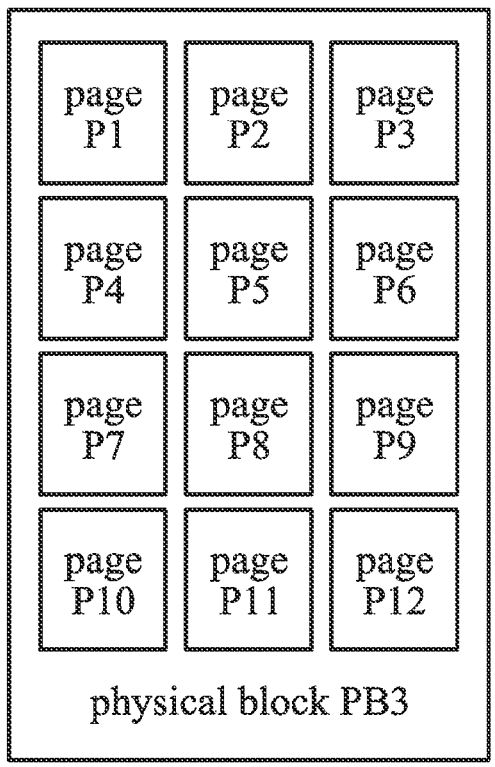
Figure 3:
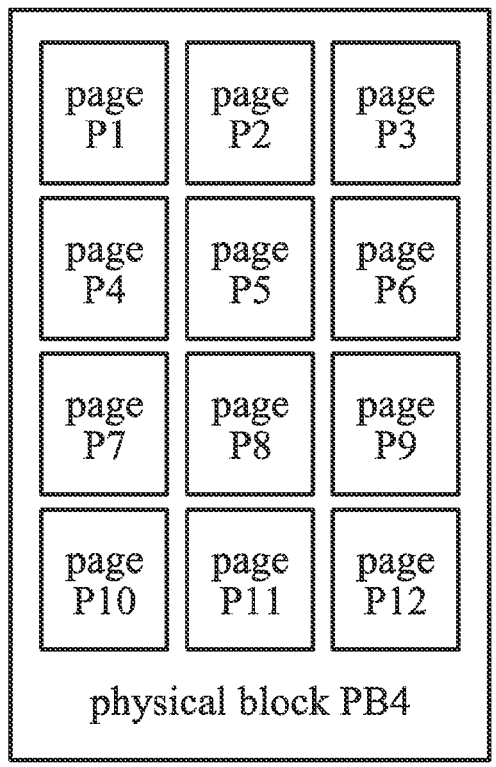

FIG. 3 shows an exemplary embodiment of the relationship between the physical blocks and pages in the flash memory.

In FIG. 3, there are four physical blocks PB1, PB2, PB3, and PB4. Each physical block is further divided into a plurality of pages P1, P2, P3 . . . P12. In the embodiment, one physical block corresponds to twelve pages. In practical design, the number of pages in one physical block is determined and adjusted according to different requirements. In different applications, the physical blocks and the pages may have different names, or even the physical blocks and the pages are grouped, which have known by one skilled in the art, thus omitting the related description.

For flash memories, such as NAND flash memories or NOR flash memories, before the flash memories which have not used yet operate a write operation, the physical blocks have t be erased. The erasing operation is performed by one unit of one physical block, while the write operation is performed by one unit of one page. The physical blocks which have been erased can perform the data write operation to the expected pages. However, in the case that one certain page has experienced the write operation, if it wants to perform the write operation to the certain page again, the physical block including the certain page has to experience the erasing operation first.

Since the range of the physical block is larger than the range of the page, if the page which has been experienced the write operation will be written again, the data movement has to be performed in advance. In other words, the data at the same address in logic may be moved from one physical block to another physical block during the data write and re-write processes.

Figure 4:
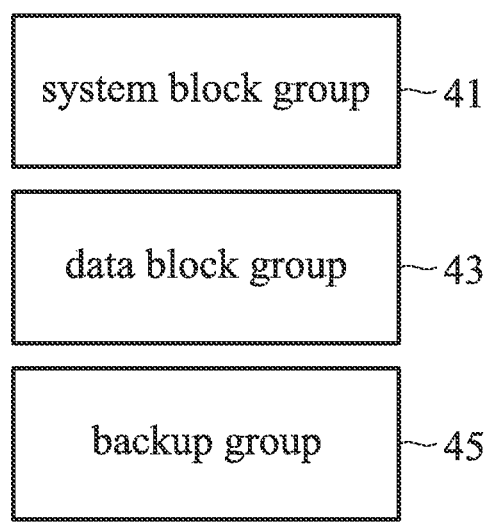
FIG. 4 shows a schematic view showing grouping of physical blocks according to an exemplary embodiment.

FIG. 4 shows a schematic view showing the grouping of physical blocks according to an exemplary embodiment.

Referring to FIG. 1, all of the physical blocks are grouped into three types: a system block group 41, a data block group 43, and a backup block group 45. The system block group 41 is used to store system data, such as the table of the logic blocks and the physical blocks, the instruction codes of the microcontroller, and various indexes. Expect the system block group 41, the data block group 43 comprises the physical blocks which practically store data. The backup block group 45 comprises the physical blocks for data movement and backup.

As described above, when one page which has experienced the write operation will be written again, the erasing operation has to be performed for the one page in advance. In other words, the data of the other page in the physical block where the one page is disposed are also copied to another physical block, which is selected from the backup block group 45, with the data of the one page. After the data is copied to the selected physical block from the backup block group 45, the selected backup block is grouped into the data block group 43, while the original physical block experiences the erasing operation and is grouped into the backup block group 45.

In other words, not only does the physical block corresponding the logic address vary over time, but also the relationship between the physical block and the area varies. Thus, the system has to record the corresponding relationship between the logic blocks and the physical blocks.

Figure 5:
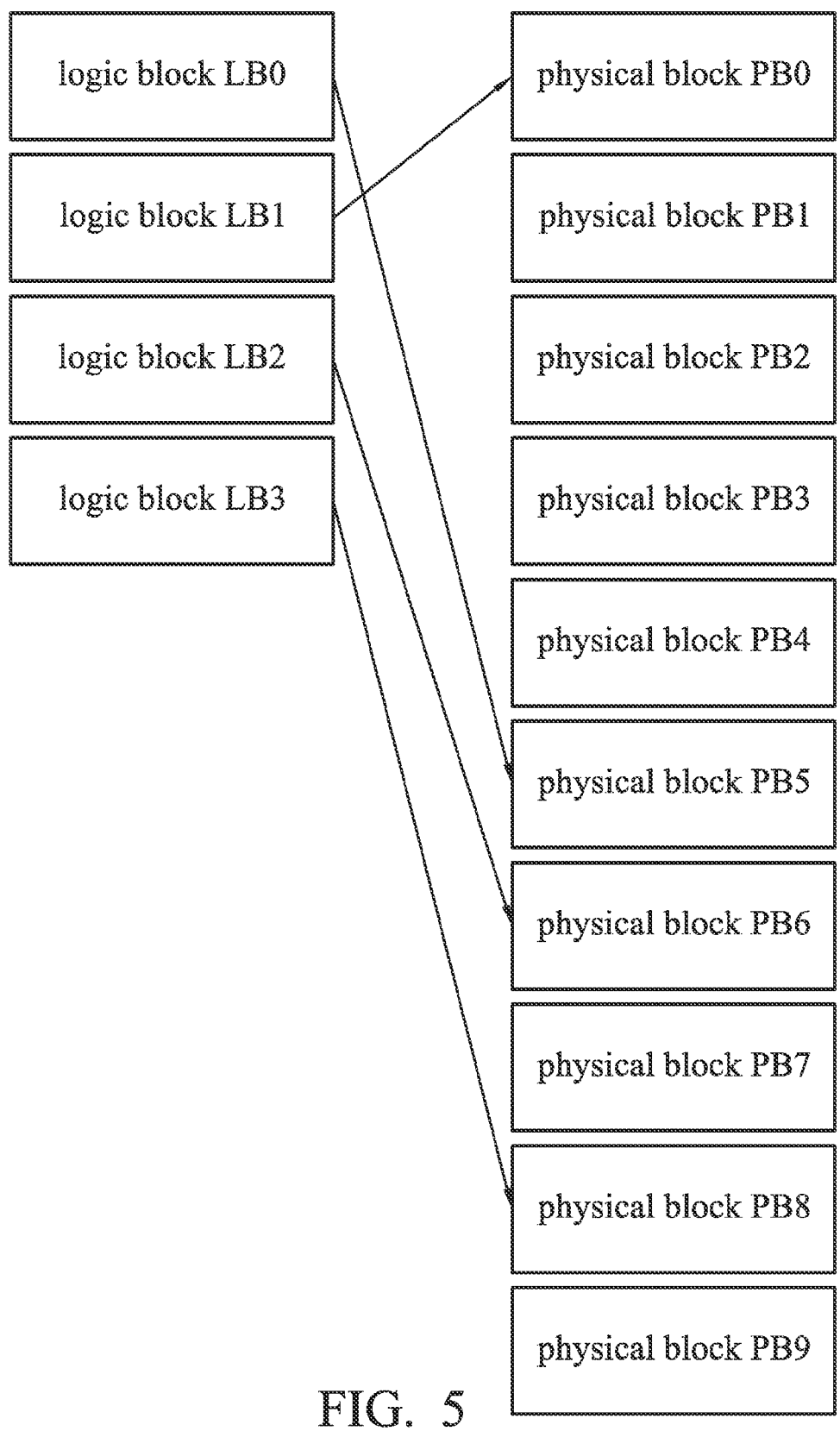
FIG. 5 shows a schematic view showing corresponding relationship between logic blocks and physical blocks by recording in a table according to an exemplary embodiment.

FIG. 5 shows a schematic view showing the corresponding relationship between the logic blocks and the physical blocks according to an exemplary embodiment. In the embodiment, the logic block LB0 corresponds to the physical bock PB5, the logic block LB1 corresponds to the physical bock PB0, the logic block LB2 corresponds to the physical block PB6, and the logic block LB3 corresponds to the physical bock PB9.

The data storage device may store the above corresponding relationship by tables or other manners.

Figure 6:
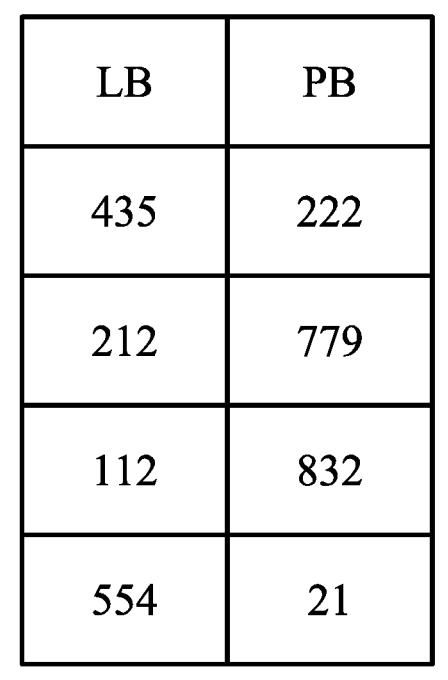

FIG. 5 shows a schematic view showing the corresponding relationship between the logic blocks and the physical blocks by recording in a table. In the embodiment of FIG. 6, the logic block 435 corresponds to the physical bock 222, the logic block 212 corresponds to the physical bock 779, the logic block 112 corresponds to the physical bock 832, and the logic block 554 corresponds to the physical bock 21.

Figure 7:
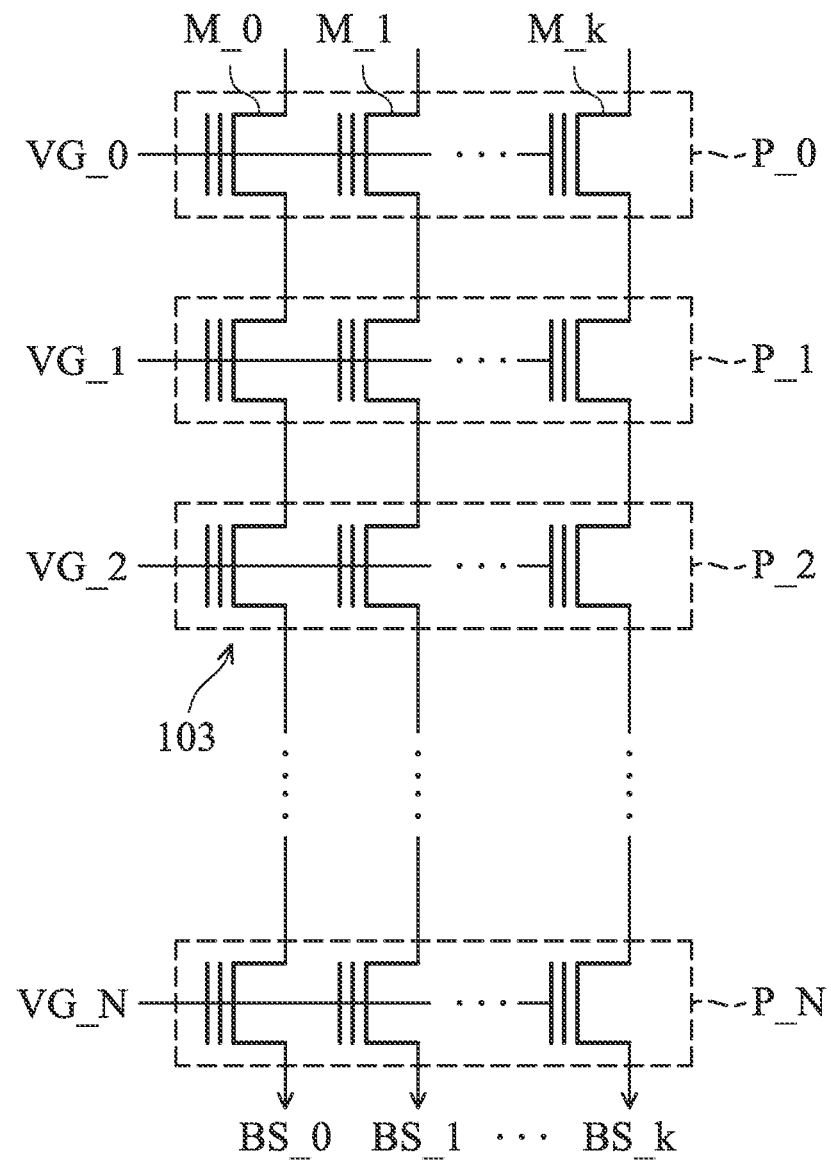
FIG. 7 shows an exemplary embodiment of a block of a memory element of an NAND flash memory.

FIG. 7 shows an exemplary embodiment of a block of a memory element of an NAND flash memory. There are pages with a predetermined number on the block, such as pages P_0, P_1, P_2, . . . , P_N. Each page comprises a plurality of memory cells M0, M_1, M_2, . . . , M_K. Through setting appropriate voltages VG_0, VG_1, VG_2, . . . , VG_N respectively to the pages, the potential stored at the floating gate of each memory cell can be readout, thereby obtaining the data stored in each memory cell.

For a single-level cell (SLC) flash memory, each memory cell store data with only one bit, that is "0" or "1". For this case, in theory, how much the charge is stored in each memory cell can be detected by applying appropriate setting voltages VG_0, VG_1, VG_2, . . . , VG_N respectively to the pages, and then the value of the corresponding data can be obtained.

In opposition, a multi-level cell (MLC) flash memory, several various setting voltages have to be applied for one read operation to determine how much the charge is stored in each memory cell and the calculate the practice contents stored in the memory cells.

Figure 8:
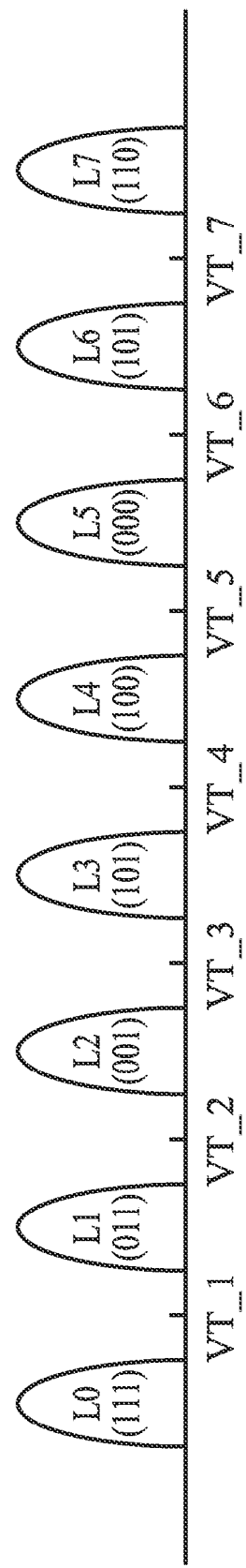
FIG. 8 shows a schematic view showing stored charge and operation voltages of a triple-level cell (PLC) flash memory according of to an exemplary embodiment.

FIG. 8 shows a schematic view showing stored charge and operation voltages of a triple-level cell (PLC) flash memory according of to an exemplary embodiment. As shown in FIG. 8, for one memory cell, the stored data is 111, 011, 001, . . . , or 110 respectively when the amount of the stored charge is in the range L0, L1, L2, . . . , or L7.

For this memory cell, in theory, when the operation voltage VT_1 is applied, the detection circuit may detects whether the charge stored in the memory cell belongs to the portion including the range L0 (that is the data "111") or the portion including the ranges L1, L2, L3, L4, L5, L6, and L7 (that is the data "011", "001", "101", "100", "000", "010", or "110").

Through applying combination of several voltages in a specific order, in theory, the data with three bits can be determined, that is the contents of the most signification bit (MSB), the central signification bit (CSB), and the least significant bit (LSB).

However, as described, with the development of the semiconductor manufacturing process toward higher density and with the achievement in lowering the cost and lengthening the usage time of the flash memories, the issue of the stability of the related circuits and memory cells becomes more important.

Figure 9:
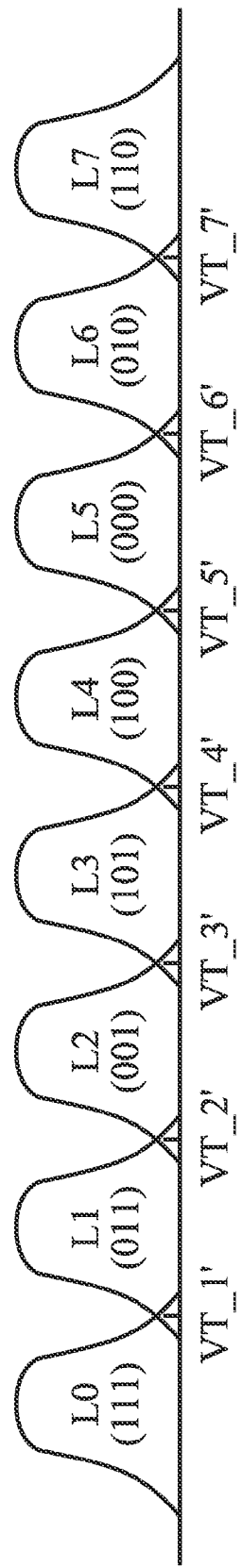
FIG. 9 shows a schematic view showing the case occurs when an operation voltage VT_1 is applied according to an exemplary embodiment.

FIG. 9 shows a schematic view showing the case in which the readout data is not correct when the operation voltage VT_1 is applied to the memory cell due to overlapping or even shift in the states of bits. In this case, for solving the issue of the incorrect data, various error correction manners are required or the operation voltage has to be dynamically adjusted.

Figure 10:
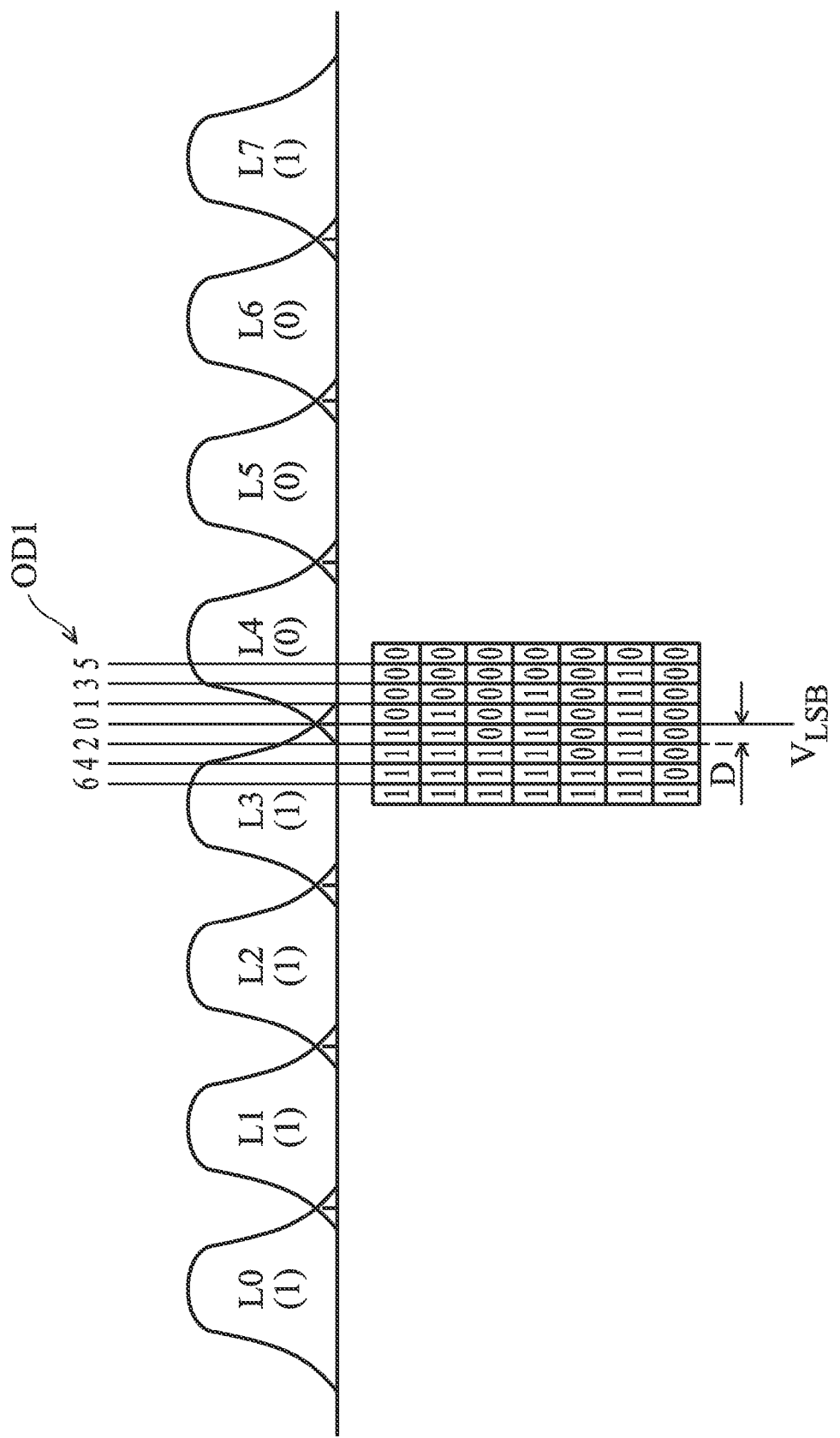
FIG. 10 shows a schematic view showing the case in which one read operation is performed by using seven operation voltages successively according to an exemplary embodiment.

FIG. 10 shows a schematic view showing the case in which the read operation is performed to the memory cell by using seven different voltages and the amount of charge at the floating gate of the memory cell is detected to determine whether the value of the LSB of the data stored in the memory cell is "0" or "1".

As shown in FIG. 10, if the amount of charge stored in the memory cell is on the left side of the voltage VLSB (that is L0, L1, L2, or L3), it represents that the content of LSB is "0". In contrary, if the amount of charge stored in the memory cell is on the right side of the voltage VLSB (that is L4, L5, L6, or L7), it represents that the content of LSB is "1".

Since there is overlapping between the states, the various voltages VLSB, VLSB+D, VLSB−D, VLSB+2D, VLSB−2D, VLSB+3D, and VLSB−3D may be applied successively. Accordingly, if the amount of charge stored in the memory cell is between LSB+D and LSB, certainly significant information can obtained according to the detection result.

The result for one bit can be obtained every time when one voltage applied. Thus, result for seven bits can be obtained by applying voltages by seven times. There are eight possible combinations for the seven buts. The correction code may be calculated and the correct bit data can be fined by the LDPC decoding circuit and manner based on the bit sequence corresponding to the seven bits. That is, the error correction is performed by using the obtained soft information with LDPC and BCH.

Figure 11:
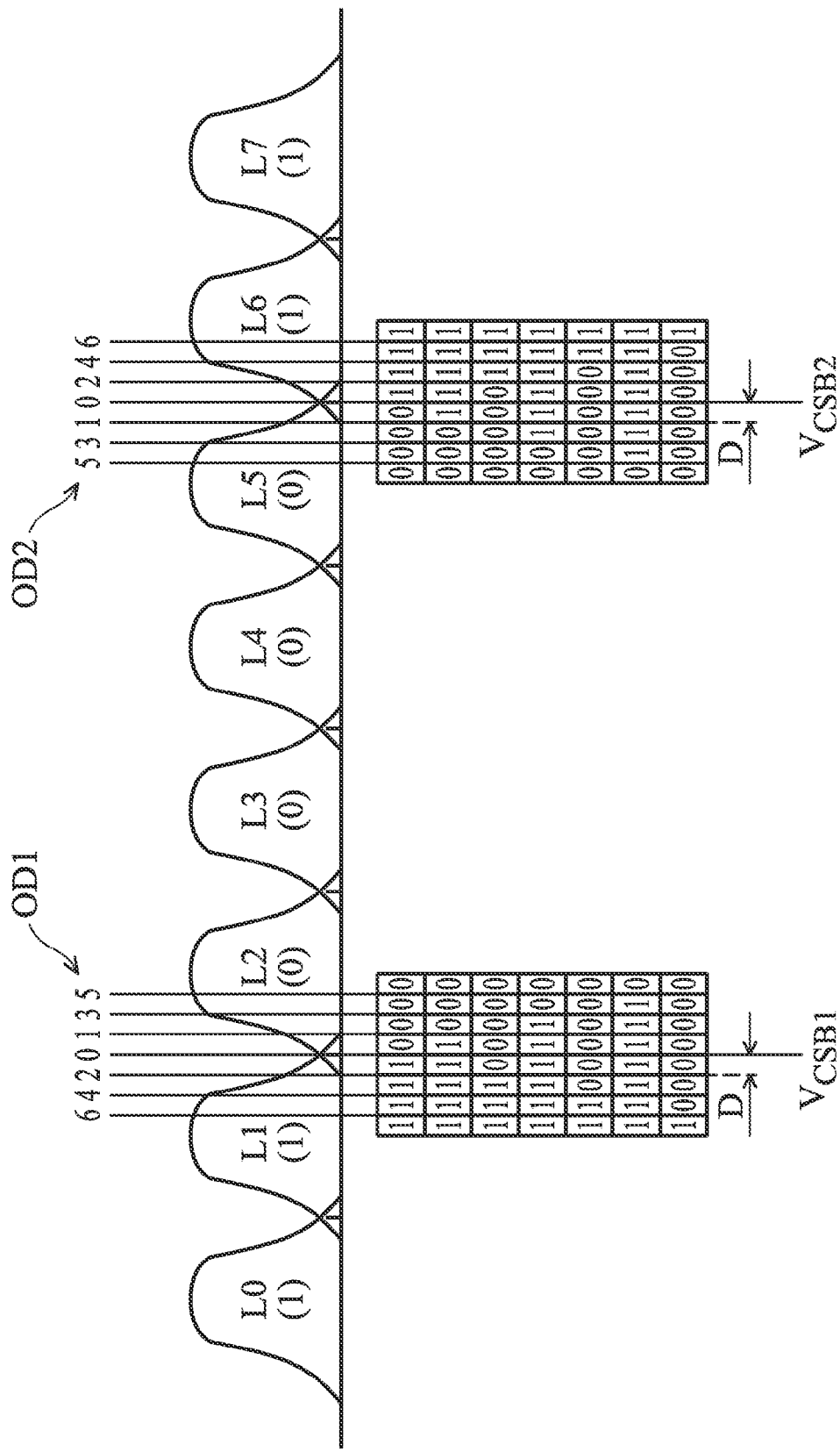
FIG. 11 shows an exemplary embodiment of a method for finding the CSB.

FIG. 11 shows an exemplary embodiment of a method for finding the CSB. CSB represents the second bit. As shown in FIG. 11, if the amount of charge stored in the memory cell is in the range L2, L3, L4, or L5, it represents that the content of CSB stored in the memory cell is "0". In contrary, if the amount of charge stored in the memory cell is in the range L0, L1, L6, or L7, it represents that the content of CSB stored in the memory cell is "1". In this configuration, it can be understood easily that two operation voltages VCSB1 and VCSB2 are required to find which range the amount of charge stored in the memory cell is in.

Similarly, several step adjustment degrees can be applied to the operation voltages VCSB1 and VCSB2, such that the read operation is performed by using different voltages successively. The bit sequence is generated according to the readout result obtained each time. The bit sequence is used to perform the error correction in coordination with LDPC and BCH.

Figure 12:
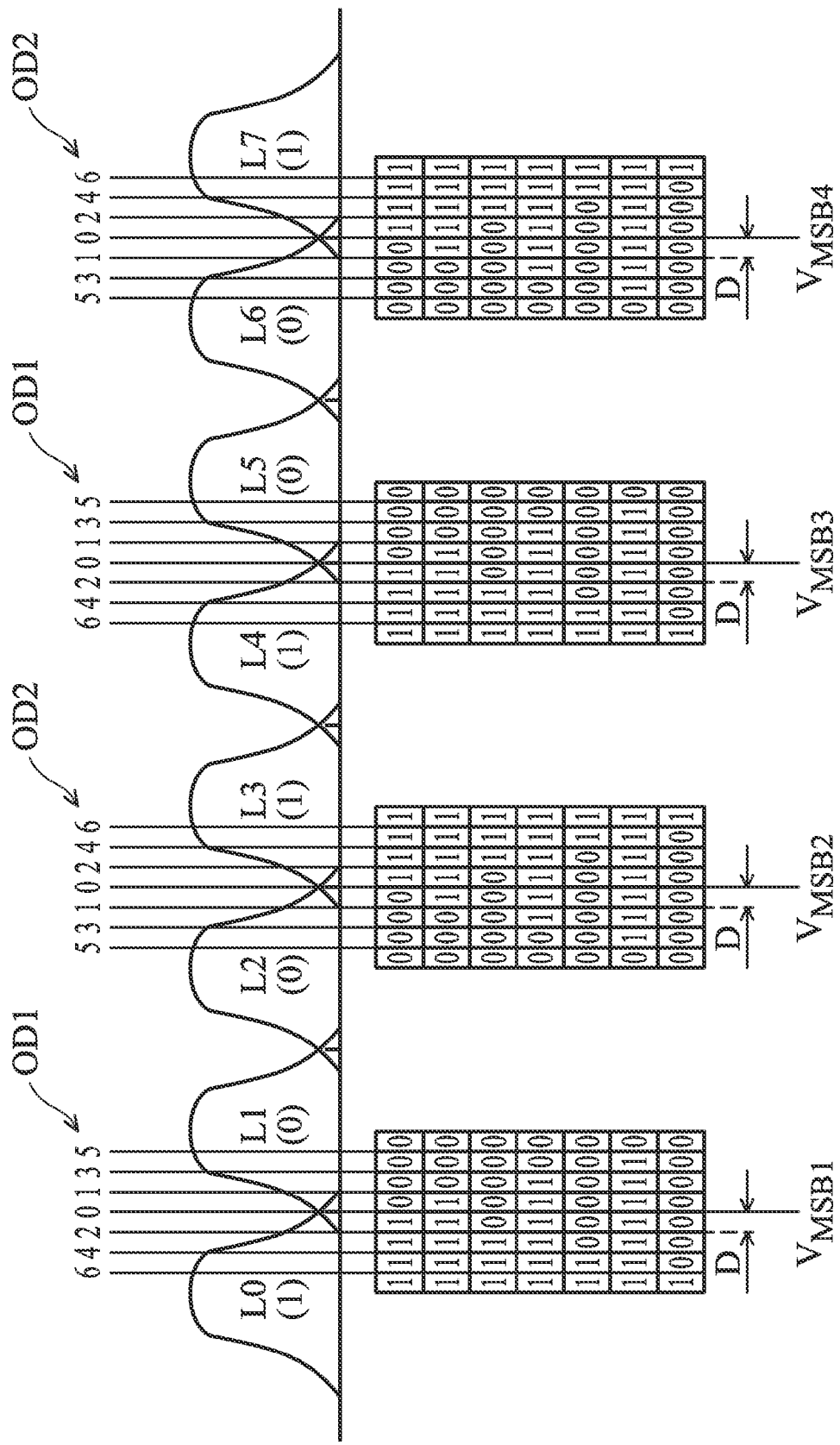
FIG. 12 shows an exemplary embodiment of a method for finding the MSB.

FIG. 12 shows an exemplary embodiment of a method for finding the MSB. MSB represents the highest bit. As shown in FIG. 12, if the amount of charge stored in the memory cell is in the range L0, L3, L4, or L5, it represents that the content of MSB stored in the memory cell is "1". In contrary, if the amount of charge stored in the memory cell is in the range L1, L2, L5, or L6, it represents that the content of MSB stored in the memory cell is "0".

Similarly, several step adjustment degrees can be applied to the operation voltages VCSB1, VCSB2, VCSB3, and VCSB4, such that the read operation is performed by using different voltages successively. The bit sequence is generated according to the readout result obtained each time. The bit sequence is used to perform the error correction in coordination with LDPC and BCH.

After the various structure and configuration is described, how to find the last page which is written validly before and then perform appropriate following operations during the recovery operation for enhancing the stability of the data will be described by referring figures. Of course, the method is not limited to be performed only after the abnormal status occurs. However, the method may be also performed during the predetermined data check or recovery operation.

Figure 13:
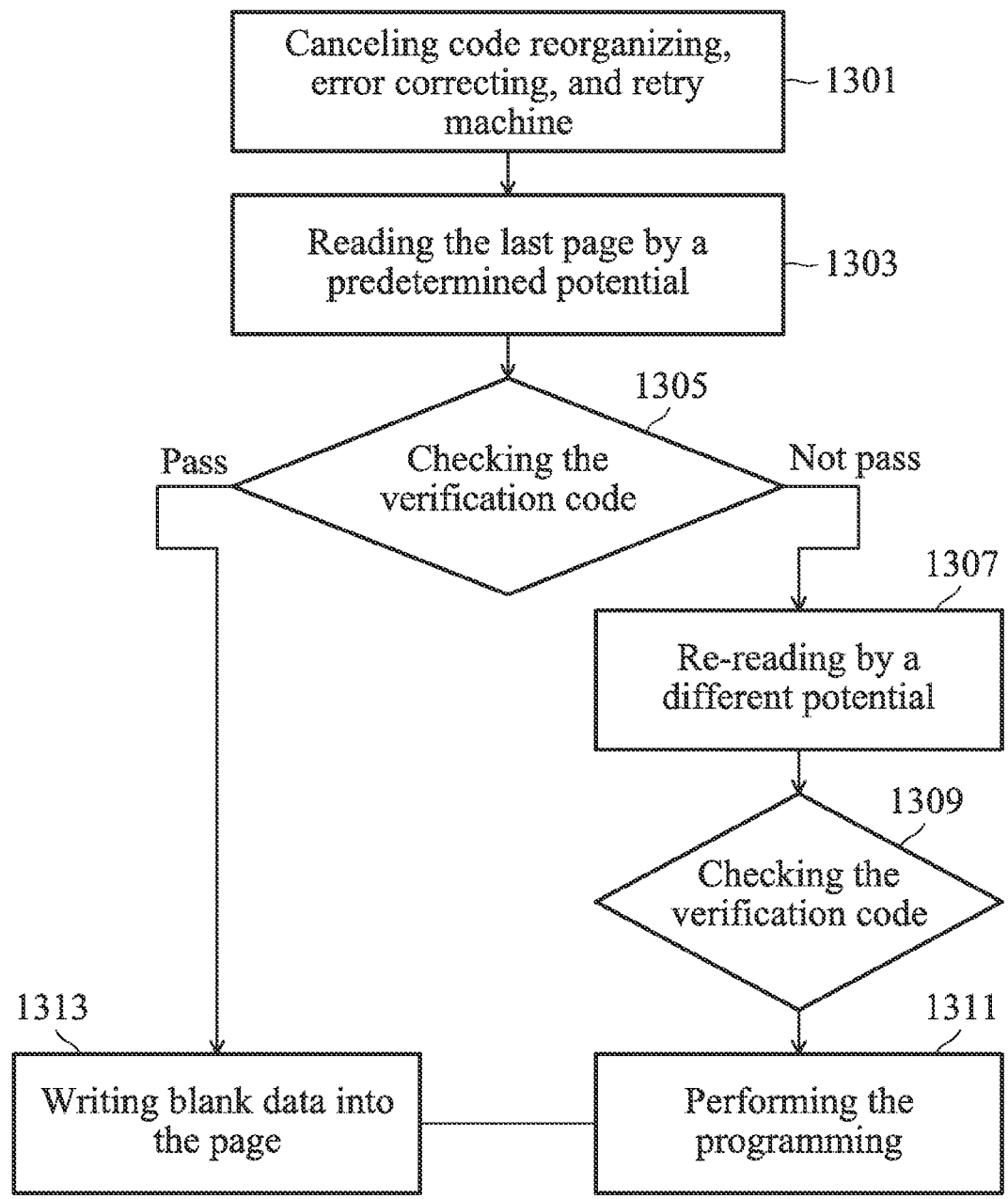
FIG. 13 shows a flow chart of a method for rapidly finding the position of the last page which is written validly according to an exemplary embodiment.

FIG. 13 shows a flow chart of a method for rapidly finding the position of the last page which is written validly according to an exemplary embodiment.

First, code reorganizing, error correcting, and retry machine is cancelled (step 1301). Then, by referring o the obtained table, the content f the page which may be the last one by using predetermined potentials (step 1303). Since the abnormal status was experienced before (such as the power being off suddenly), the message of the last page recorded in the table may be not correct. After the data is read out, an operation related to a verification code or error correction is performed (step 1305). If the check passes, blank data is written into the next page (step 1313).

If any problem is discovered according to the check result, the re-read machine is enabled to try to read data again by different potentials. After the re-read operation, the verification code is checked again (step 1309). If the check passes, correct data is then written into the page (step 1311). Finally, blank data is written into the next page (step 1313).

The above machine is suitable for a non-volatile memory device which is composed of a single-level cell (SLC) flash memory and a multi-level cell (MLC) flash memory. For a multi-level cell flash memory, a complex recovery operation is configured. Relatively, for a single-level cell flash memory with greater stability, the above method can be used to accomplish the recovery operation rapidly.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A non-volatile memory device comprising:
a non-volatile memory divided into a plurality of physical blocks, wherein each physical block is divided into a plurality of physical pages; and
a connection interface connected to a host; and
a controller,
wherein the controller selects one physical block from the plurality of physical block to serve as an operation physical block, and when receiving a write command from the host, the controller writes data corresponding to the write command into the operation physical block,
wherein when the controller performs a data read operation to read the operation physical block, if the data read operation is failed, the controller enables retry machine by using different potentials,
wherein when the controller performs a recovery operation after an abnormal status occurs, the controller cancels the retry machine and reads the physical page in the operation physical block which is written finally at the last time, and checks a verification code of the physical page, and
wherein when check result of the verification code represents that an error occurs, the controller enables the retry machine by using different potentials to retry to read the physical page and re-programming the physical page.

2. The non-volatile memory device as claimed in claim 1, wherein when the controller performs the data read operation to read the operation physical block, if the data read operation is failed, the controller enables retry machine by using different potentials, and wherein when the controller performs the recovery operation after an abnormal status occurs, the controller cancels the retry machine to find the physical page in the operation physical block which is written finally at the last time.

3. The non-volatile memory device as claimed in claim 1, wherein when the controller performs the data read operation to read the operation physical block, the controller enables error correction machine to identify and correct errors, and wherein when the controller performs the recovery operation after an abnormal status occurs, the controller cancels the error correction machine to find the physical page in the operation physical block which is written finally at the last time.

4. The non-volatile memory device as claimed in claim 1, wherein when the controller performs the data read operation to read the operation physical block, the controller enables random decoding machine to recover the data, and wherein when the controller performs the recovery operation after an abnormal status occurs, the controller cancels the random decoding machine to find the physical page in the operation physical block which is written finally at the last time.

5. The non-volatile memory device as claimed in claim 1, wherein the controller uses a table to record that the plurality of physical pages in the operation physical block correspond to logic pages of which logic blocks, and wherein when the controller performs the recovery operation after the abnormal status occurs, the controllers updates the table.

6. The non-volatile memory device as claimed in claim 1, wherein the controller writes blank data into the physical page in the operation physical block which is written finally at the last time.

7. The non-volatile memory device as claimed in claim 1, wherein the non-volatile memory is a first non-volatile memory that is a single-level cell non-volatile memory, and the non-volatile memory device further comprises a second non-volatile memory that is a multi-level cell non-volatile memory.

8. The non-volatile memory device as claimed in claim 7, wherein when controller performs the recovery operation, the controller recovers the single-level cell non-volatile storage and the multi-level cell non-volatile storage by different recovery manners.

9. The non-volatile memory device as claimed in claim 1, wherein the non-volatile memory device is a flash memory.

10. The non-volatile memory device as claimed in claim 1, wherein the non-volatile memory device is a flash hard disk.

11. A controller for a non-volatile memory device, wherein the non-volatile memory device comprises non-volatile memory and a connection interface, the non-volatile memory is divided into a plurality of physical blocks, each physical block is divided into a plurality of physical pages, and the connection interface is connected to a host, wherein the controller selects one physical block from the plurality of physical block to serve as an operation physical block, and when receiving a write command from the host, the controller writes data corresponding to the write command into the operation physical block, wherein when the controller performs a data read operation to read the operation physical block, if the data read operation is failed, the controller enables retry machine by using different potentials, wherein when the controller performs a recovery operation after an abnormal status occurs, the controller cancels the retry machine and reads the physical page in the operation physical block which is written finally at the last time, and checks a verification code of the physical page, and wherein when check result of the verification code represents that an error occurs, the controller enables the retry machine by using different potentials to retry to read the physical page and re-programming the physical page.

12. The controller as claimed in claim 11, wherein when the controller performs the data read operation to read the operation physical block, if the data read operation is failed, the controller enables retry machine by using different potentials, and wherein when the controller performs the recovery operation after an abnormal status occurs, the controller cancels the retry machine to find the physical page in the operation physical block which is written finally at the last time.

13. The controller as claimed in claim 11, wherein when the controller performs the data read operation to read the operation physical block, the controller enables error correction machine to identify and correct errors, and wherein when the controller performs the recovery operation after an abnormal status occurs, the controller cancels the error correction machine to find the physical page in the operation physical block which is written finally at the last time.

14. The controller as claimed in claim 11, wherein when the controller performs the data read operation to read the operation physical block, the controller enables random decoding machine to recover the data, and wherein when the controller performs the recovery operation after an abnormal status occurs, the controller cancels the random decoding machine to find the physical page in the operation physical block which is written finally at the last time.

15. The controller as claimed in claim 11, wherein the controller uses a table to record that the plurality of physical pages in the operation physical block correspond to logic pages of which logic blocks, and wherein when the controller performs the recovery operation after the abnormal status occurs, the controllers updates the table.

16. The controller as claimed in claim 11, wherein the controller writes blank data into the physical page in the operation physical block which is written finally at the last time.

17. The controller as claimed in claim 11 further comprising a multi-potential non-volatile storage, wherein the non-volatile memory is a single-potential non-volatile memory.

18. The controller as claimed in claim 17, wherein when controller performs the recovery operation, the controller recovers the single-potential non-volatile memory and the multi-potential non-volatile storage by different recovery manners.

19. The controller as claimed in claim 11, wherein the non-volatile memory device is a flash memory.

20. The controller as claimed in claim 11, wherein the non-volatile memory device is a flash hard disk.

* * * * *